United States Patent
Mori et al.

(10) Patent No.: US 12,400,995 B2
(45) Date of Patent: Aug. 26, 2025

(54) SEMICONDUCTOR MANUFACTURING APPARATUS AND METHOD OF MANUFACTURING SEMICONDUCTOR DEVICE

(71) Applicant: Kioxia Corporation, Tokyo (JP)

(72) Inventors: Ai Mori, Yokkaichi Mie (JP); Hiroaki Ashidate, Mie Mie (JP)

(73) Assignee: Kioxia Corporation, Tokyo (JP)

( * ) Notice: Subject to any disclaimer, the term of this patent is extended or adjusted under 35 U.S.C. 154(b) by 539 days.

(21) Appl. No.: 17/930,988

(22) Filed: Sep. 9, 2022

(65) Prior Publication Data

US 2023/0197672 A1 Jun. 22, 2023

(30) Foreign Application Priority Data

Dec. 16, 2021 (JP) ................. 2021-204521

(51) Int. Cl.
*H01L 21/00* (2006.01)
*H01L 23/00* (2006.01)

(52) U.S. Cl.
CPC .............. *H01L 24/80* (2013.01); *H01L 24/74* (2013.01); *H01L 2224/74* (2013.01);
(Continued)

(58) Field of Classification Search
CPC ..... H01L 24/80; H01L 24/74; H01L 2224/74; H01L 2224/80201; H01L 2224/80895; H01L 2224/80896; H01L 2224/80908; H01L 21/2007; H01L 21/67288; H01L 21/682; H01L 21/187; H01L 21/76251; H01L 2223/54426; H01L 23/544; H01L 24/75; H01L 2224/04105; H01L 2224/24137; H01L 2224/12105;
(Continued)

(56) References Cited

U.S. PATENT DOCUMENTS 10,279,575 B2 * 5/2019 Wagenleitner ........ H01L 21/187
10,438,920 B2 10/2019 Otsuka et al.
2021/0327773 A1 10/2021 Kohama

FOREIGN PATENT DOCUMENTS

JP 2012-175043 A 9/2012
JP 2016-526299 A 9/2016
(Continued)

*Primary Examiner* — Niki H Nguyen
(74) *Attorney, Agent, or Firm* — Finnegan, Henderson, Farabow, Garrett & Dunner, LLP

(57) ABSTRACT

In one embodiment, a semiconductor manufacturing apparatus includes a magnification difference acquirer configured to acquire a value of difference in magnification between a first substrate and a second substrate. The apparatus further includes a deformation amount determiner configured to determine a value of deformation amount of a chuck that holds the first or second substrate, based on the value of the difference in magnification. The apparatus further includes a gap determiner configured to determine a value of a gap between the first substrate and the second substrate, based on the value of the deformation amount. The apparatus further includes a bonding controller configured to control the deformation amount to the determined value and control the gap to the determined value, before the first substrate and the second substrate are bonded together.

20 Claims, 14 Drawing Sheets

(52) U.S. Cl.
CPC ............... *H01L 2224/80201* (2013.01); *H01L 2224/80895* (2013.01); *H01L 2224/80896* (2013.01); *H01L 2224/80908* (2013.01)

(58) Field of Classification Search
CPC ..... H01L 2224/73104; H01L 23/49816; H01L 24/13; H01L 24/73
See application file for complete search history.

(56) References Cited

FOREIGN PATENT DOCUMENTS

| | | | |
|---|---|---|---|
| JP | 2018-93018 | A | 6/2018 |
| JP | 6407803 | B2 | 10/2018 |
| JP | 2019-129286 | A | 8/2019 |
| JP | 6640546 | B2 | 2/2020 |
| WO | WO 2020/045158 | A1 | 3/2020 |

* cited by examiner

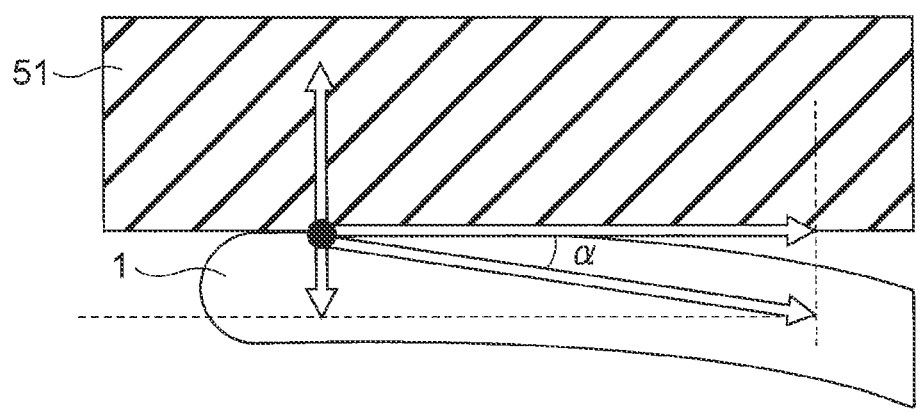
FIG. 8
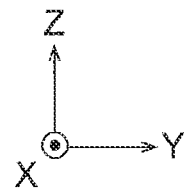

SEMICONDUCTOR MANUFACTURING APPARATUS AND METHOD OF MANUFACTURING SEMICONDUCTOR DEVICE

CROSS-REFERENCE TO RELATED APPLICATION

This application is based upon and claims the benefit of priority from the prior Japanese Patent Application No. 2021-204521, filed on Dec. 16, 2021, the entire contents of which are incorporated herein by reference.

FIELD

Embodiments described herein relate to a semiconductor manufacturing apparatus and a method of manufacturing a semiconductor device.

BACKGROUND

When bonding substrates together, a chuck that holds one of the substrates may be deformed to correct difference in magnification between these substrates. In such a case, if deformation amount of the chuck is too large or too small, the substrates might not be properly bonded with each other.

BRIEF DESCRIPTION OF THE DRAWINGS

FIG. 8 is an enlarged cross-sectional view showing the operation of the semiconductor manufacturing apparatus of the comparative example of the first embodiment;

DETAILED DESCRIPTION

Figure 1A:
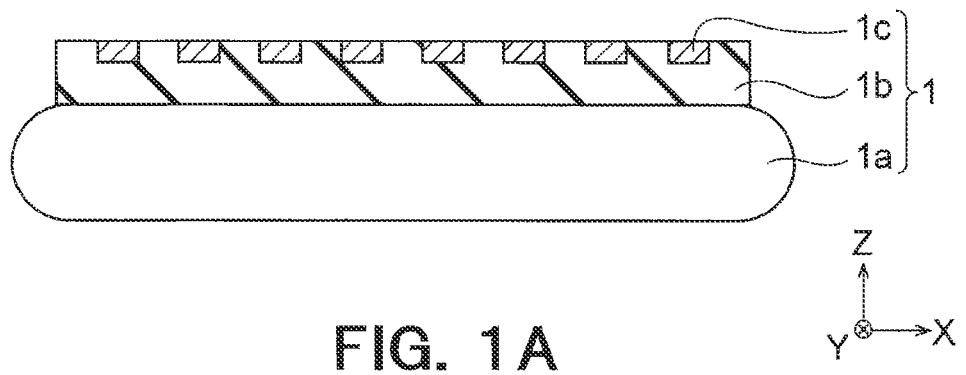
FIGS. 1A to 1C are cross-sectional views showing a method of manufacturing a semiconductor device of a first embodiment.

Embodiments will now be explained with reference to the accompanying drawings. In FIG. 1A to FIG. 14, the same components are designated by the same reference numerals, and redundant description will be omitted.

In one embodiment, a semiconductor manufacturing apparatus includes a magnification difference acquirer configured to acquire a value of difference in magnification between a first substrate and a second substrate. The apparatus further includes a deformation amount determiner configured to determine a value of deformation amount of a chuck that holds the first or second substrate, based on the value of the difference in magnification. The apparatus further includes a gap determiner configured to determine a value of a gap between the first substrate and the second substrate, based on the value of the deformation amount. The apparatus further includes a bonding controller configured to control the deformation amount to the determined value and control the gap to the determined value, before the first substrate and the second substrate are bonded together.

First Embodiment

Figure 1B:
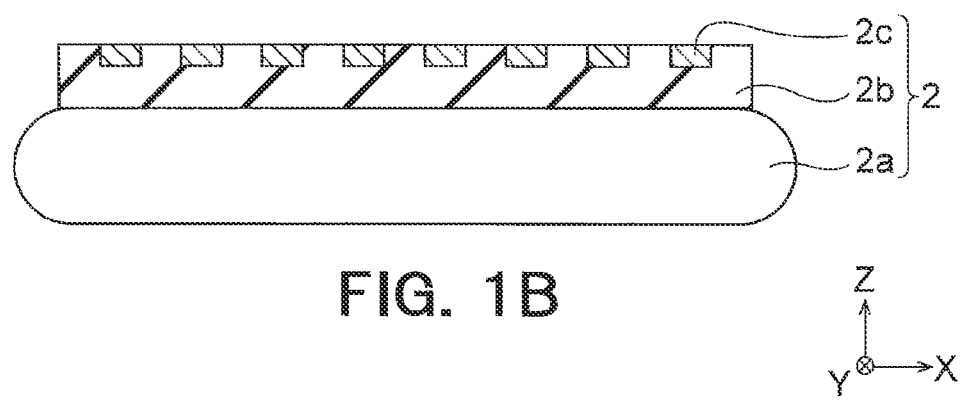
Figure 1C:
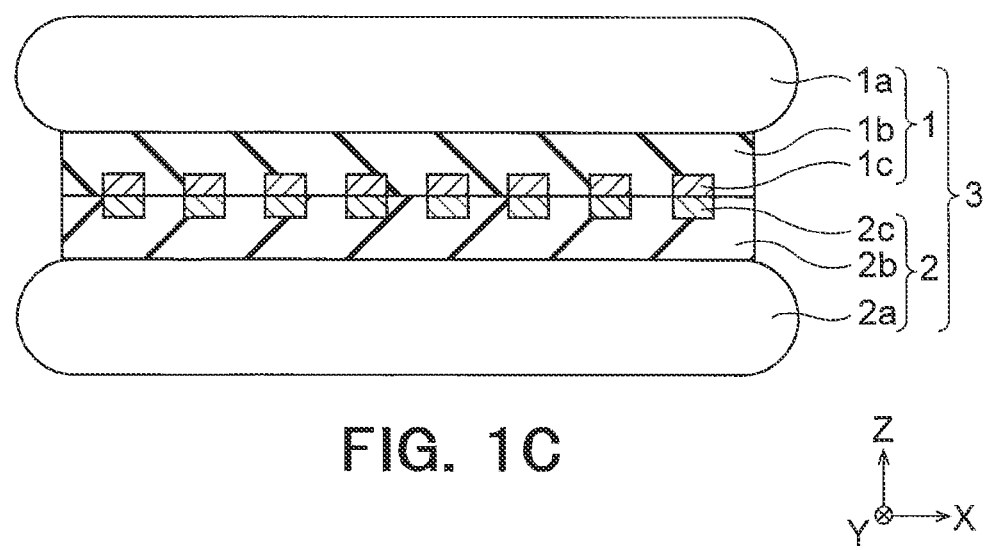

FIGS. 1A to 1C are cross-sectional views showing a method of manufacturing a semiconductor device of a first embodiment.

The semiconductor device of the present embodiment is manufactured by bonding an upper wafer 1 shown in FIG. 1A and a lower wafer 2 shown in FIG. 1B. The upper wafer 1 is an example of the first substrate and the lower wafer 2 is an example of the second substrate. FIG. 1C shows a bonded wafer 3 including the upper wafer 1 and the lower wafer 2 that are bonded together. The bonded wafer 3 is to be diced into multiple chips (semiconductor devices), subsequently.

FIGS. 1A to 1C show X, Y, and Z directions perpendicular to each other. In this specification, a +Z direction is treated as an upward direction, and a −Z direction is treated as a downward direction. The −Z direction may or may not coincide with the direction of gravity.

As shown in FIG. 1A, the upper wafer 1 includes a wafer 1a, an inter layer dielectric 1b formed on the wafer 1a, and a plurality of metal pads 1c formed in the inter layer dielectric 1b. The wafer 1a is a semiconductor wafer such as a Si (silicon) wafer, for example. The inter layer dielectric 1b is a laminated insulating film including a $SiO_2$ film (silicon oxide film), a SiN film (silicon nitride film), and the like, for example. The inter layer dielectric 1b may include various devices such as memory cell arrays and transistors or may include various conductive layers such as interconnect layers and plug layers. The metal pad 1c is, for example, a metal layer including a Cu (copper) layer or the like.

As shown in FIG. 1B, the lower wafer 2 includes a wafer 2a, an inter layer dielectric 2b formed on the wafer 2a, and a plurality of metal pads 2c formed in the inter layer dielectric 2b. The materials and the structures of the wafer 2a, the inter layer dielectric 2b, and the metal pads 2c are the same as those of the wafer 1a, the inter layer dielectric 1b, and the metal pads 1c, respectively. For example, the upper wafer 1 includes a memory cell array and the lower wafer 2 includes a transistor that controls this memory cell array.

The bonded wafer 3 includes the lower wafer 2 and the upper wafer 1 arranged on the lower wafer 2, as shown in FIG. 1C. The orientation of the upper wafer 1 shown in FIG. 1C is opposite to the orientation of the upper wafer 1 shown in FIG. 1A. In FIG. 1C, a lower surface of the inter layer dielectric 1b is bonded with an upper surface of the inter layer dielectric 2b, and a lower surface of each metal pad 1c is joined to an upper surface of each corresponding metal pad 2c.

When the semiconductor device of the present embodiment is manufactured, there might be a case in which a pattern formed on the wafer 1a does not have the same magnification as that of a pattern formed on the wafer 2a. For example, the magnification of the metal pads 1c and the magnification of the metal pads 2c might not be the same. In this case, each metal pad 1c might not be properly joined to each corresponding metal pad 2c, which may cause bonding defect, such as a high resistance at a joint and disconnection.

To cope with this, when manufacturing the semiconductor device of the present embodiment, in order to correct the difference in magnification between the upper wafer 1 and the lower wafer 2, a chuck holding the upper wafer 1 or the lower wafer 2 is deformed. Then, with the chuck deformed, the upper wafer 1 and the lower wafer 2 are bonded together. Accordingly, each metal pad 1c can be suitably joined to each corresponding metal pad 2c. For example, misalignment of about 0 to 10 ppm can be correct. Further details of the correction of difference in magnification will be described later.

Figure 2:
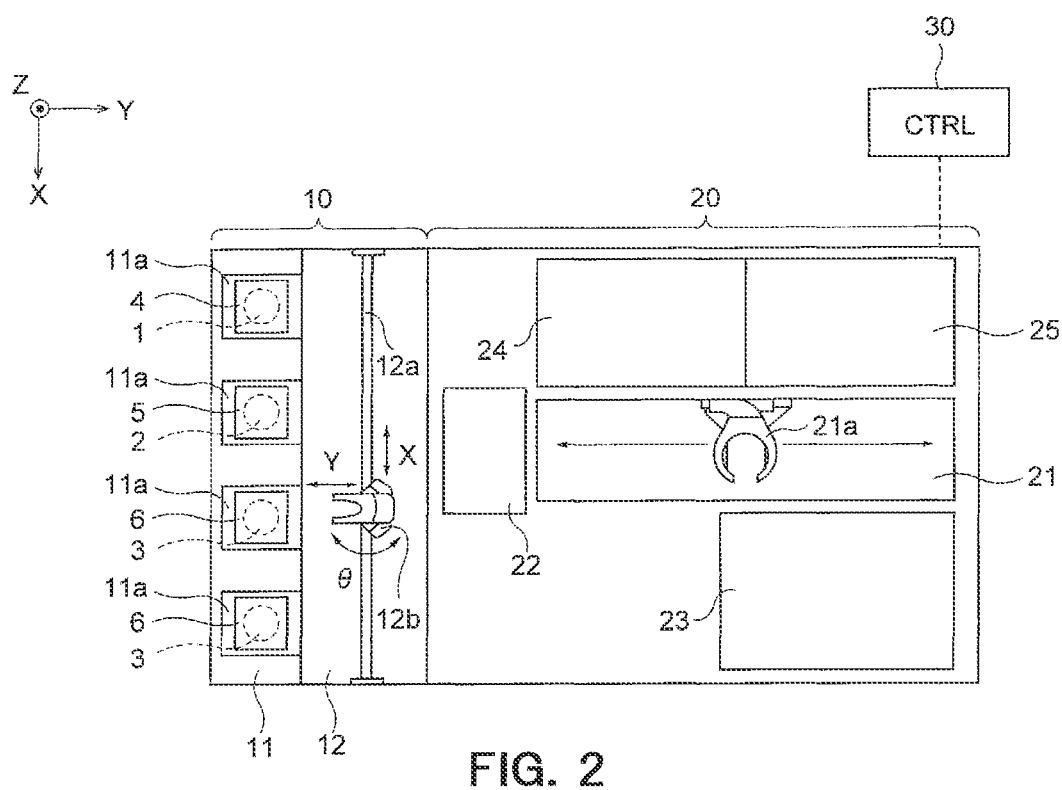
FIG. 2 is a plan view showing the configuration of a semiconductor manufacturing apparatus of the first embodiment.

FIG. 2 is a plan view showing the configuration of the semiconductor manufacturing apparatus of the first embodiment. The semiconductor manufacturing apparatus of the present embodiment is a bonding apparatus of bonding the upper wafer 1 and the lower wafer 2 together.

As shown in FIG. 2, the semiconductor manufacturing apparatus of the present embodiment includes a wafer conveyer 10, a wafer processer 20, and a controller 30. The wafer conveyer 10 conveys the upper wafer 1 and the lower wafer 2 from the outside of a housing of the semiconductor manufacturing apparatus into the inside thereof, and conveys the bonded wafer 3 from the inside of the housing of the semiconductor manufacturing apparatus to the outside thereof. The wafer processer 20 processes the upper wafer 1, the lower wafer 2, and the bonded wafer 3, and for example, bonds the upper wafer 1 and the lower wafer 2 together. The controller 30 controls various operations of the semiconductor manufacturing apparatus, and controls, for example, the conveyance of each wafer by the wafer conveyer 10 as well as the processing on each wafer by the wafer processer 20.

The wafer conveyer 10 includes a mounting portion 11 on which each wafer is mounted and a conveyance portion 12 that conveys each wafer. The mounting portion 11 includes a plurality of mounting tables 11a. The conveyance portion 12 includes a conveyance passage 12a and a conveyance robot 12b.

The mounting tables 11a are used for mounting thereon a cassette 4 in which the upper wafer 1 is housed, a cassette 5 in which the lower wafer 2 is housed, and cassettes 6 in which the bonded wafers 6 are housed. Two cassettes 6 shown in FIG. 2 are a cassette 6 for housing a normal bonded wafer 3 and a cassette 6 for housing an abnormal bonded wafer 3.

The conveyance passage 12a extends in the X direction. The conveyance robot 12b can move in a +X direction on the conveyance passage 12a and can turn in +θ directions around the Z direction on the conveyance passage 12a. The conveyance robot 12b can convey each wafer between the mounting table 11a located in a −Y direction and the wafer processer 20 located in a +Y direction. With this configuration, each wafer can be conveyed to the inside of the housing and each wafer can be conveyed to the outside of the housing.

The wafer processer 20 includes a conveyance block 21 that conveys each wafer, and processing blocks 22, 23, 24, 25 that process each wafer. The conveyance block 21 includes a conveyance robot 21a.

The conveyance robot 21a in the conveyance block 21 can convey each wafer between the wafer conveyer 10 and the processing blocks 22 to 25. The processing block 22 moves the upper wafer 1, the lower wafer 2, and the bonded wafer 3 in a +Z direction. The processing block 23 modifies the surface of the upper wafer 1 and the surface of the lower wafer 2. The processing block 24 hydrophilizes the surface of the upper wafer 1 and the surface of the lower wafer 2. The processing block 25 bonds the upper wafer 1 and the lower wafer 2 together.

Figure 3:
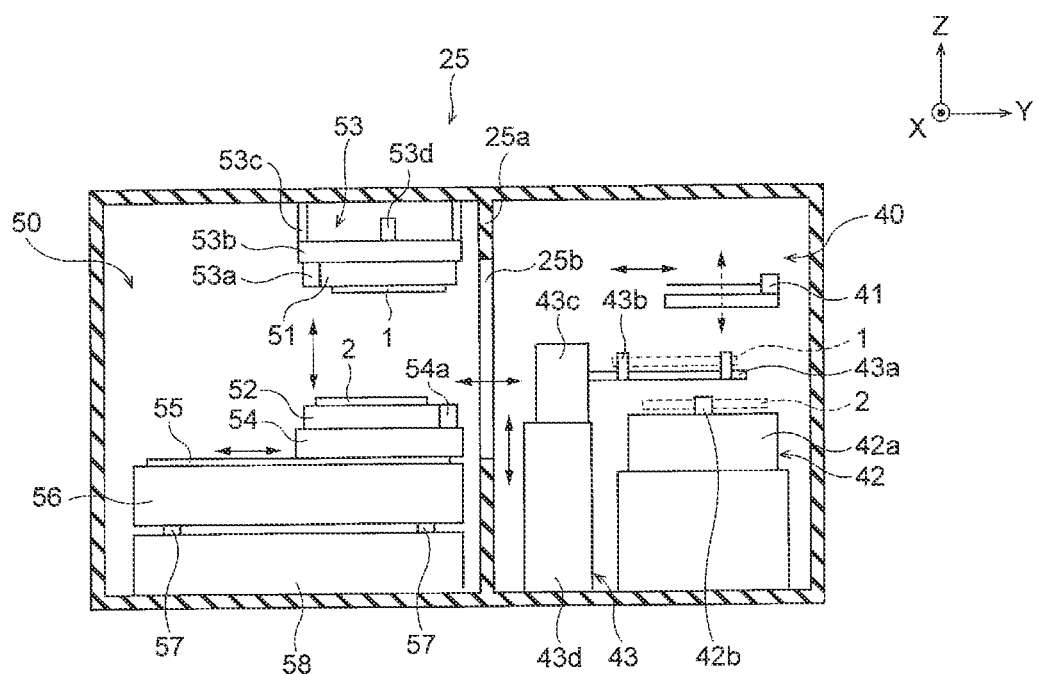
FIG. 3 is a cross-sectional view showing the configuration of a processing block 25 of the first embodiment.

FIG. 3 is a cross-sectional view showing the configuration of the processing block 25 of the first embodiment.

The processing block 25 includes a conveyance area 40 and a bonding area 50 that are separated by an inner wall 25a of the processing block 25. The conveyance area 40 and the bonding area 50 are communicated with each other through a gateway 25b provided in the inner wall 25a. The conveyance area 40 is an area for conveying each wafer between the inside and the outside of the processing block 25. The bonding area 50 is an area for bonding the upper wafer 1 and the lower wafer 2 together. The bonding area 50 is an example of a bonder.

The conveyance area 40 includes a conveyance module 41, a positioning module 42, and an inverting module 43. The positioning module 42 includes a base 42a and a detector 42b. The inverting module 43 includes a holding arm 43a, a plurality of holding members 43b, a driver 43c, and a support column 43d.

The conveyance module 41 conveys each wafer in the X direction, the Y direction, the Z direction, and the like. Specifically, the conveyance module 41 conveys the upper wafer 1 and the lower wafer 2 from the outside of the bonding area 50 to the inside thereof and conveys the bonded wafer 3 from the inside of the bonding area 50 to the outside thereof.

The positioning module 42 adjusts the orientation of a notch in each wafer. Specifically, the positioning module 42 supports the wafer by the base 42a, detects the position of the notch of the wafer on the base 42a by the detector 42b, and rotates the wafer by the base 42a of the detected position of the notch. In this manner, the orientation of the notch is adjusted.

The inverting module 43 inverts the orientation of the upper wafer 1. Specifically, the inverting module 43 holds the upper wafer 1 by the holding members 43b on the holding arm 43a and inverts the orientation of the upper wafer 1 by the holding arm 43a. The holding arm 43a is supported by the support column 43d via the driver 43c and is driven by the driver 43c. In this manner, the orientation of the upper wafer 1 is inverted. For example, when the metal pads 1c of the upper wafer 1 before the inversion are orientated in the +Z direction, the metal pads 1c of the upper wafer 1 are to be orientated in the −Z direction after the inversion.

The bonding area 50 includes an upper chuck 51, a lower chuck 52, an upper chuck supporter 53, a lower chuck mover 54, two rails 55 extending in the Y direction, a lower chuck mover 56, two rails 57 extending in the X direction, and a mounting table 58. The upper chuck supporter 53 includes an upper imager 53a, a support member 53b, a plurality of support columns 53c, and a striker 53d. The lower chuck mover 54 includes a lower imager 54a. The upper supporter 53 is an example of a first support. The lower chuck mover 54, the rails 55, the lower chuck mover 56, the rails 57, and the mounting table 58 are examples of a second support. The striker 53d is an example of a presser.

The upper chuck 51 is supported by the upper chuck supporter 53 and holds the upper wafer 1 from above. The upper chuck supporter 53 is provided on a ceiling surface of a container of the processing block 25 and supports the upper chuck 51 from above. Specifically, the upper chuck supporter 53 supports the upper chuck 51 by the support member 53b and also supports the support member 53b by the support columns 53c. The upper imager 53a is provided to the support member 53b and images the lower wafer 2. Hence, the state of the lower wafer 2 can be detected. The striker 53d is provided on the support member 53b and presses the upper wafer 1. With this configuration, the upper wafer 1 and the lower wafer 2 can be bonded together.

The lower chuck 52 is supported by the lower chuck mover 54, the rails 55, the lower chuck mover 56, the rails 57, and the mounting table 58, and holds the lower wafer 2 from below. The lower chuck mover 54, the rails 55, the lower chuck mover 56, the rails 57, and the mounting table 58 are provided on a floor surface of the container of the processing block 25, and support the lower chuck 52 from below. The lower chuck mover 54 can move the lower chuck 52 in the +Y direction as the lower chuck mover 54 moves on the rails 55 provided to the lower chuck mover 56. The lower chuck mover 56 can move the lower chuck 52 in the +X direction as the lower chuck mover 56 moves on the rails 57 provided to the mounting table 58. Further, the lower chuck mover 54 can move the lower chuck 52 up and down or rotate the lower chuck 52 as the lower chuck mover 54 moves in the +Z direction or rotates around an axis parallel to the Z direction. Accordingly, it is possible to increase or decrease the gap between the upper wafer 1 and the lower wafer 2. The lower imager 54a is provided to the lower chuck mover 54, and images the upper wafer 1. Accordingly, the state of the upper wafer 1 can be detected.

Figure 4:
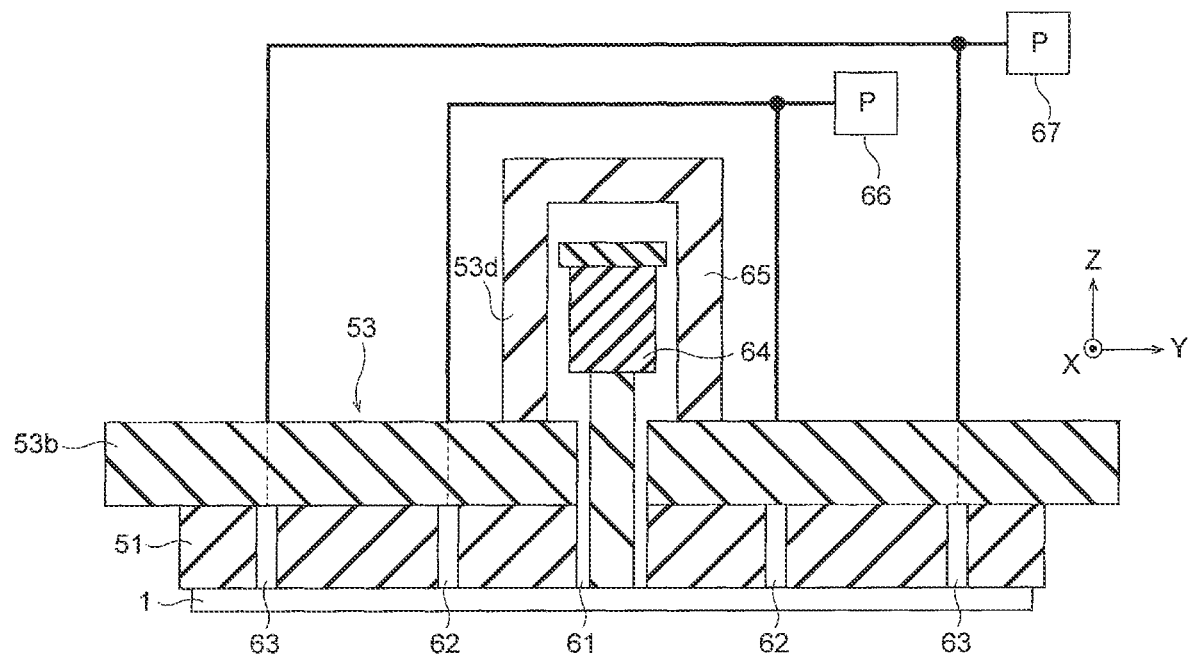
FIG. 4 is a cross-sectional view showing the configuration of an upper chuck 51 and the like of the first embodiment.

FIG. 4 is a cross-sectional view showing the configuration of the upper chuck 51 and the like of the first embodiment.

As shown in FIG. 4, the bonding area 50 of the present embodiment further includes a through-hole 61, a plurality of suction tubes 62, a plurality of suction tubes 63, an actuator 64, a cylinder 65, a vacuum pump 66, and a vacuum pump 67.

The through-hole 61 extends through the upper chuck 51 and the support member 53b. The striker 53d that presses the upper wafer 1 includes the actuator 64 and the cylinder 65. Specifically, the cylinder 65 is provided on the support member 53b. The actuator 64 includes an upper portion provided in the cylinder 65 and a lower portion provided in the through-hole 61. As the upper portion of the actuator 64 moves up and down in the cylinder 65, the lower portion of the actuator 64 also moves up and down in the through-hole 61. As a result, the lower portion of the actuator 64 presses the upper wafer 1 held by the upper chuck 51. The striker 53d of the present embodiment is driven by air supplied from a regulator (not shown).

The suction tubes 62, 63 extend through the upper chuck 51 and are used for sucking the upper wafer 1. The upper chuck 51 of the present embodiment holds the upper wafer 1 by sucking the upper wafer 1 from the suction tubes 62, 63. The vacuum pumps 66, 67 are connected to the suction tubes 62, 63, respectively, and evacuate the upper wafer 1 from the suction tubes 62, 63. The upper wafer 1 is held by the action of this evacuation. In the bonding area 50 of the present embodiment, the vacuum pump 66 and the vacuum pump 67 can be independently driven from each other. The suction tubes 62, 63 and the vacuum pumps 66, 67 are examples of a sucker.

The bonding area 50 of the present embodiment can exert an upward force from the suction tubes 62, 63 to the upper wafer 1 and a downward force from the actuator 64 (the striker 53d) to the upper wafer 1. Further details of these forces will be described later.

Figure 5A:
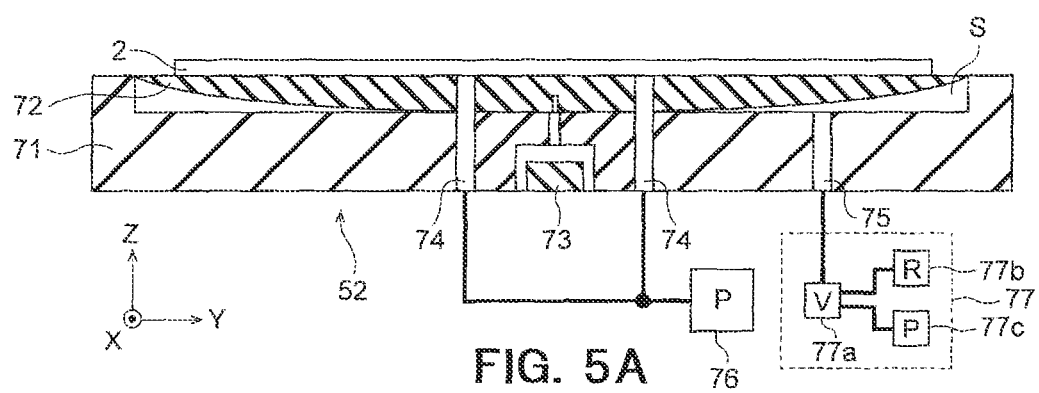
FIGS. 5A and 5B are cross-sectional views showing the configuration of a lower chuck 52 and the like of the first embodiment.
Figure 5B:
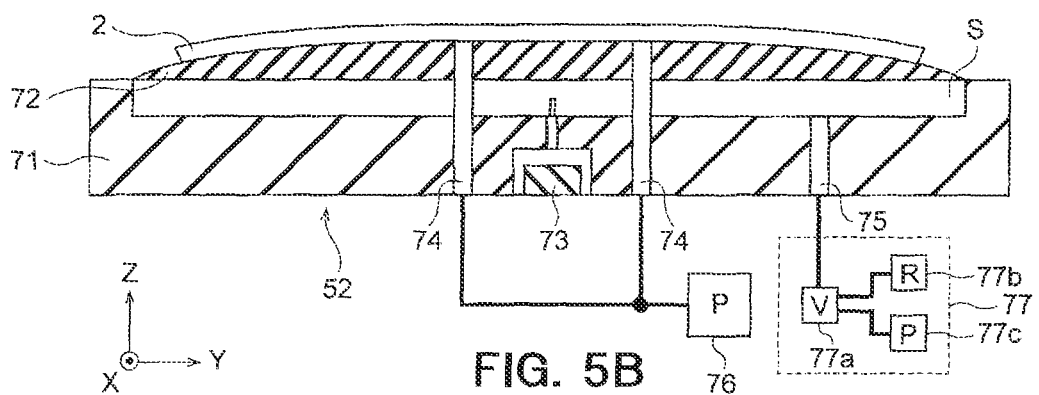

FIGS. 5A and 5B are cross-sectional views showing the configuration of the lower chuck 52 and the like of the first embodiment.

FIGS. 5A and 5B show respective situations in which the same lower chuck 52 is in different states. Hereinafter, the details of the lower chuck 52 will be described with reference to FIG. 5A. In this description, FIG. 5B will be also referred to as appropriate.

The chuck 52 of the present embodiment includes a base 71, a mounting portion 72, a measurer 73, a plurality of suction tubes 74, and an air hole 75, as shown in FIG. 5A. The bonding area 50 of the present embodiment further includes a vacuum pump 76 and a deformer 77 as components for the lower chuck 52. The deformer 77 includes a switch valve 77a, a regulator 77b, and a vacuum pump 77c.

The base 71 supports the mounting portion 72 on which the lower wafer 2 is mounted from below. There is a space S between the substrate 71 and the mounting portion 72. The mounting portion 72 has a diameter that is not less than a diameter of the lower wafer 2 in a plan view. As shown in FIG. 5A, the thickness of the mounting portion 72 becomes thicker toward the center of the mounting portion 72 and thinner farther from the center of the mounting portion 72. The mounting portion 72 is made of a ceramic material, for example.

The mounting portion 72 can be deformed as shown in FIGS. 5A and 5B. In the bonding area 50 of the present embodiment, the lower wafer 2 mounted on the mounting portion 72 can be deformed by deforming the mounting portion 72. Accordingly, the difference in magnification between the upper wafer 1 and the lower wafer 2 can be corrected. In the bonding area 50 of the present embodiment, misalignment between the metal pads 1c and the metal pads 2c can be corrected by bonding the upper wafer 1 and the lower wafer 2 together in a state in which the lower wafer 2 is deformed by the mounting portion 72. The mounting portion 72 shown in FIG. 5A has a flat upper surface; therefore, the lower wafer 2 also has a flat shape. The mounting portion 72 shown in FIG. 5B has an upper surface curved in an upwardly convex shape; therefore, the lower wafer 2 also has a curved shape that is upwardly convex.

The measurer 73 is provided at the center of the base 71, and measures displacement amount (deformation amount) of the mounting portion 72. The suction tubes 74 extend through the base 71 and the mounting portion 72 and are used for sucking the lower wafer 2. The lower chuck 52 of the present embodiment holds the lower wafer 2 by sucking the lower wafer 2 from the suction tubes 74. The vacuum pump 76 is connected to the suction tubes 74 and evacuates the lower wafer 2 from the suction tubes 74. The lower wafer 2 is held by the action of this evacuation.

The air hole 75 extends through the base 71 and is used for supplying air to the space S and exhausting air from the space S. The deformer 77 deforms the mounting portion 72 by supplying air to the space S and exhausting the air from the space S. Specifically, the deformer 77 supplies air to the space S by the regulator 77b and exhausts the air from the space S by the vacuum pump 77c. Switching between air supply and air exhaust is performed by the switch valve 77a.

FIGS. 6A to 6D are cross-sectional views showing the operation of the semiconductor manufacturing apparatus of the first embodiment. FIGS. 6A to 6D show how the upper wafer 1 held by the upper chuck 51 and the lower wafer 2 held by the lower chuck 52 are bonded together.

Figure 6A:
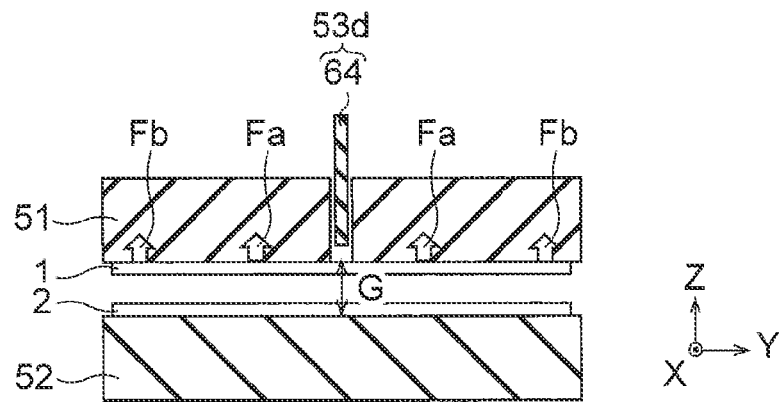
FIGS. 6A to 6D are cross-sectional views showing the operation of the semiconductor manufacturing apparatus of the first embodiment.

FIG. 6A shows the upper wafer 1 and the lower wafer 2 before the bonding is started. FIG. 6A shows a suction force Fa acting on the upper wafer 1 from the suction tubes 62 (FIG. 4) and a suction force Fb acting on the upper wafer 1 from the suction tubes 63 (FIG. 4). At this point, the striker 53d is not in contact with the upper wafer 1, and no pressing force acts from the striker 53d to the upper wafer 1.

FIG. 6A further shows a gap G between the upper wafer 1 and the lower wafer 2 before the bonding is started. The gap G in the present embodiment corresponds to a distance between a lower surface of the upper wafer 1 and an upper surface of the lower wafer 2 (see FIG. 14). The gap G shown in FIG. 6A is a distance between a center of the upper wafer 1 and a center of the lower wafer 2. The center of the upper wafer 1 is located on the central axis of the upper wafer 1, and the center of the lower wafer 2 is located on the central axis of the lower wafer 2.

The lower wafer 2 shown in FIG. 6A may be deformed by the mounting portion 72. By performing the bonding with the lower wafer 2 deformed, the difference in magnification between the upper wafer 1 and the lower wafer 2 can be corrected.

Figure 6B:
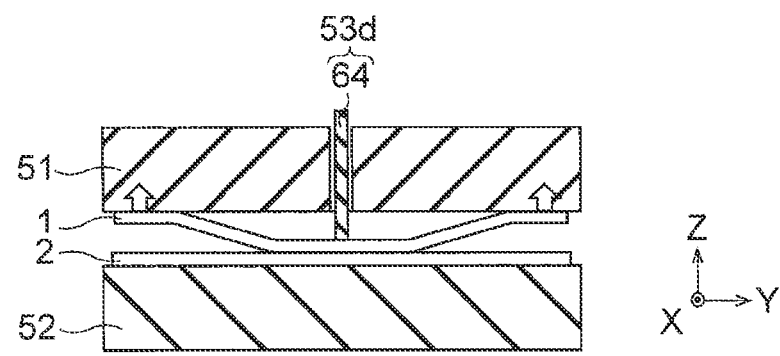

When the upper wafer 1 and the lower wafer 2 are bonded together, the vacuum pump 66 (FIG. 4) is stopped to stop evacuation from the suction tubes 62. Thereafter, while the upper wafer 1 is being sucked by the suction tubes 63, the upper wafer 1 is pressed by the striker 53d (FIG. 6B). In the present embodiment, the striker 53d presses the center of the upper wafer 1 against the center of the lower wafer 2, and the suction tubes 63 suck a portion other than the center of the upper wafer 1. Therefore, the bonding of the upper wafer 1 with the lower wafer 2 progresses from the centers of the upper wafer 1 and the lower wafer 2 toward the outer peripheral portions thereof. That is, the contact region between the upper wafer 1 and the lower wafer 2 extends from the centers of the upper wafer 1 and the lower wafer 2 toward the outer peripheral portions thereof.

The progress of bonding stops, thereafter. This is called as a wait state. FIG. 6B shows the upper wafer 1 and the lower wafer 2 in the wait state.

Figure 6C:
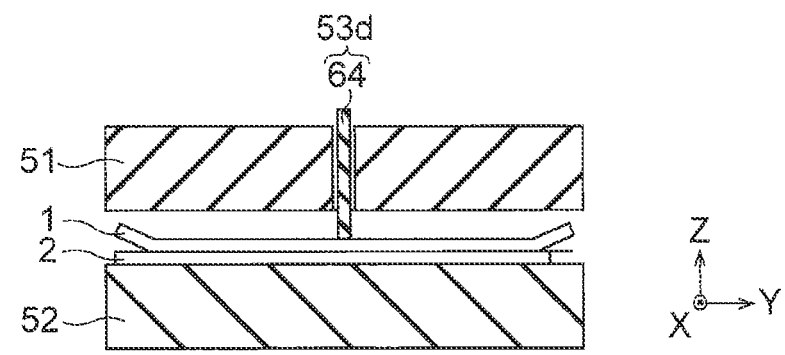

In the semiconductor manufacturing apparatus of the present embodiment, when the bonding reaches the wait state, in a state in which the upper wafer 1 is pressed by the striker 53d, the vacuum pump 67 (FIG. 4) is stopped to stop the evacuation from the suction tubes 63. As a result, the upper wafer 1 falls onto the lower wafer 2 and thereby the bonding between the upper wafer 1 and the lower wafer 2 further progresses (FIG. 6C).

Figure 6D:
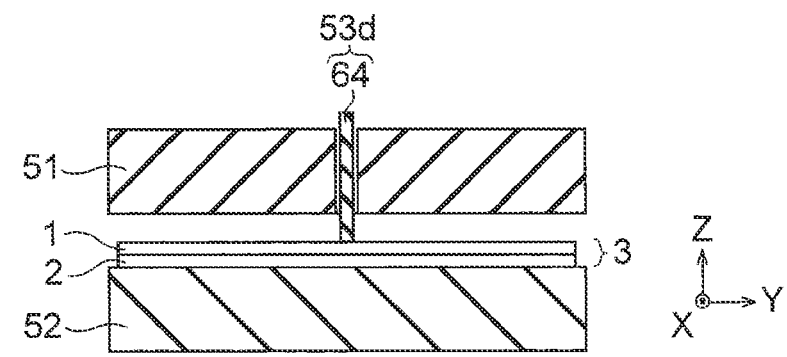

In this manner, the bonding between the upper wafer 1 and the lower wafer 2 progresses to end portions of the upper wafer 1 and the lower wafer 2, and the bonding is then completed (FIG. 6D). FIG. 6D shows the bonded wafer 3 obtained by bonding the upper wafer 1 with the lower wafer 2 together.

Now, the operation of the controller 30 (FIG. 2) of the present embodiment will be described.

The controller 30 acquires a value of the difference in magnification between the upper wafer 1 and the lower wafer 2 before the bonding is started. Then, the controller 30 determines a value of the deformation amount of the mounting portion 72 (lower chuck 52) based on the value of the difference in magnification, determines a value of the gap G based on the value of the deformation amount, and determines a value of the pressing force by the striker 53d based on the value of the gap G.

Before the bonding is started, the controller 30 controls the deformation amount of the mounting portion 72 to the determined value and controls the gap G between the upper wafer 1 and the lower wafer 2 to the determined value. Then, the controller 30 controls the operation of the bonding area 50 to bond the upper wafer 1 and the lower wafer 2 together as shown in FIGS. 6A to 6D. During this bonding, the controller 30 controls the deformation amount of the mounting portion 72 to the determined value and controls the pressing force by the striker 53d to the determined value. In addition, the gap G between the upper wafer 1 and the lower wafer 2 is set to the determined value at the moment when the bonding is started (the moment shown in FIG. 6A).

According to the present embodiment, by controlling the deformation amount, the gap G, and the pressing force to the above respective values, the upper wafer 1 and the lower wafer 2 can be suitably bonded together. Further details of the effects will be described later.

Comparative Example

Figure 7A:
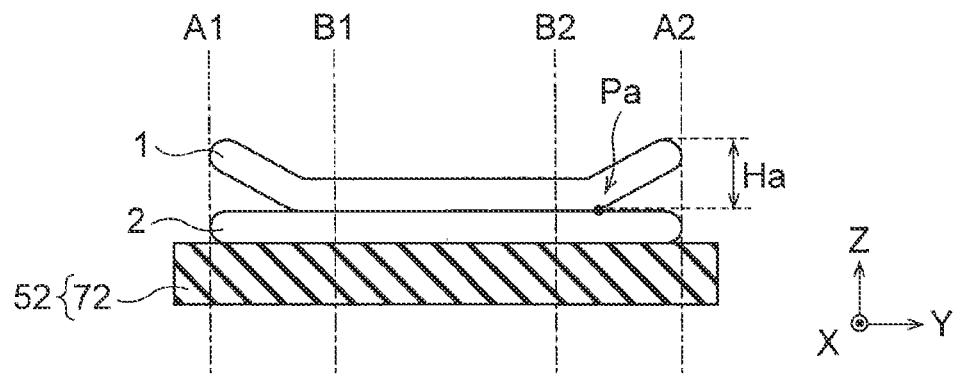
FIGS. 7A to 7C are cross-sectional view showing the operation of a semiconductor manufacturing apparatus of a comparative example of the first embodiment.
Figure 7B:
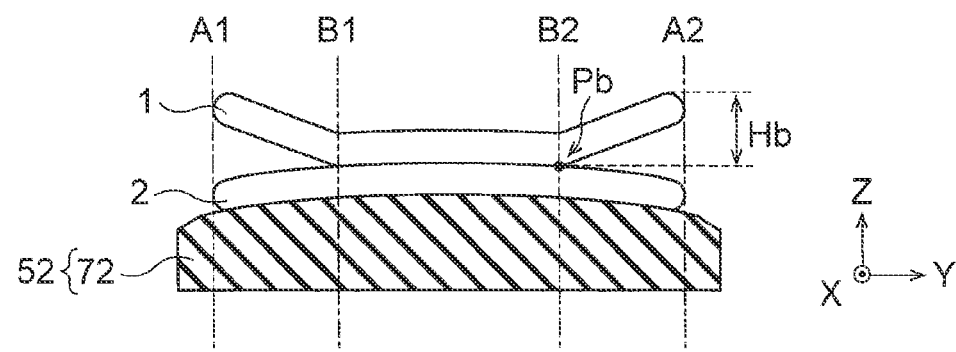
Figure 7C:
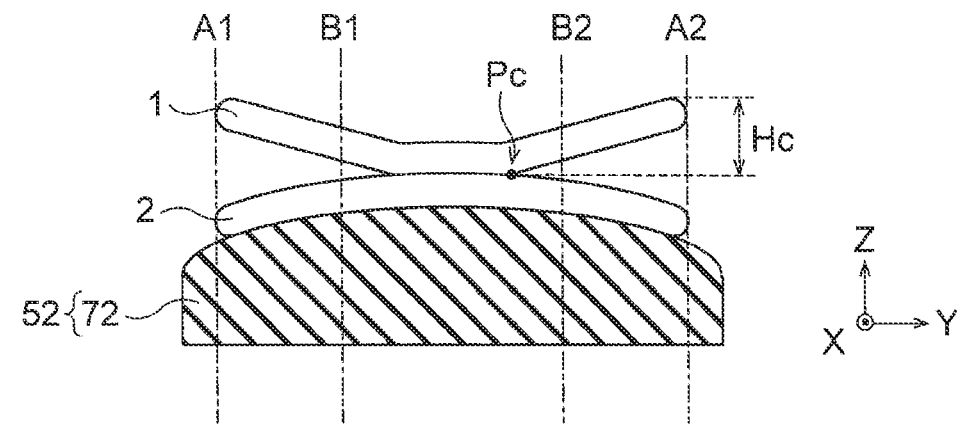

FIGS. 7A to 7C are cross-sectional views showing the operation of the semiconductor manufacturing apparatus of a comparative example of the first embodiment.

FIGS. 7A to 7C each shows the upper wafer 1 and the lower wafer 2 that are in the wait state shown in FIG. 6B. Straight lines A1, A2 pass through portions near the end portions of the upper wafer 1 and the lower wafer 2. Straight lines B1 and B2 pass through portions between the centers of the upper wafer 1 and the lower wafer 2 and the end portions thereof.

In FIG. 7A, the deformation amount of the lower chuck 52 is small; therefore, the lower wafer 2 is hardly deformed. FIG. 7A shows each end Pa of the contact region between the upper wafer 1 and the lower wafer 2, and a height Ha of an upper end portion of the upper wafer 1 with respect to the end Pa. The ends Pa are located outward of the straight lines B1, B2.

In FIG. 7B, the deformation amount of the lower chuck 52 is medium; therefore, the lower wafer 2 is slightly deformed. FIG. 7B shows each end Pb of the contact region between the upper wafer 1 and the lower wafer 2, and a height Hb of the upper end portion of the upper wafer 1 with respect to the end Pb. The ends Pb are located on the straight lines B1, B2.

In FIG. 7C, the deformation amount of the lower chuck 52 is large; therefore, the lower wafer 2 is greatly deformed. FIG. 7C shows each end Pc of the contact region between the upper wafer 1 and the lower wafer 2, and a height Hc of the upper end portion of the upper wafer 1 with respect to the end Pc. The ends Pc are located inward of the straight lines B1 and B2.

Each of the ends Pa, Pb, and Pc is a stop position of the progress at which the progress of bonding between the upper wafer 1 and the lower wafer 2 stops. The straight lines B1, B2 indicate appropriate stop positions of the progress. Hence, the deformation amount of the lower chuck 52 shown in FIG. 7A is too small, and the deformation amount of the lower chuck 52 shown in FIG. 7C is too large. On the other hand, the deformation of the lower chuck 52 shown in FIG. 7B is appropriate.

In the bonding between the upper wafer 1 and the lower wafer 2 together, the lower chuck 52 is deformed in order to correct the difference in magnification between the upper wafer 1 and the lower wafer 2. Hence, the deformation amount of the lower chuck 52 is determined based on the difference in magnification between the upper wafer 1 and the lower wafer 2. However, if the deformation amount of the lower chuck 52 is too small or too large, the stop position of the progress becomes an inappropriate position.

As shown in FIG. 7A, if the progress of bonding is too large, the upper wafer 1 is peeled off from the upper chuck 51 before the wait state is reached, so that an error in the bonding position between the upper wafer 1 and the lower wafer 2 might become larger. On the other hand, as shown in FIG. 7C, if the progress of bonding is too small, an error in the bonding position between the upper wafer 1 and the lower wafer 2 might become larger.

FIG. 8 is an enlarged cross-sectional view showing the operation of the semiconductor manufacturing apparatus of the comparative example of the first embodiment.

In FIG. 8, an upward arrow indicates a suction force acting on the upper wafer 1, and a diagonal arrow indicates a tension acting on the upper wafer 1. A tension can be decomposed into a force indicated by a downward arrow and a force indicated by a horizontal arrow. FIG. 8 further shows an angle α between the diagonal arrow and the horizontal arrow.

When the bonding between the upper wafer 1 and the lower wafer 2 progresses to respective positions near the end portions of the upper wafer 1, the angle α becomes larger. Consequently, the downward force for peeling the upper wafer 1 from the upper chuck 51 becomes larger than the upward force acting on the upper wafer 1. As a result, the upper wafer 1 is peeled off from the upper chuck 51 before the wait state is reached.

Figure 9A:
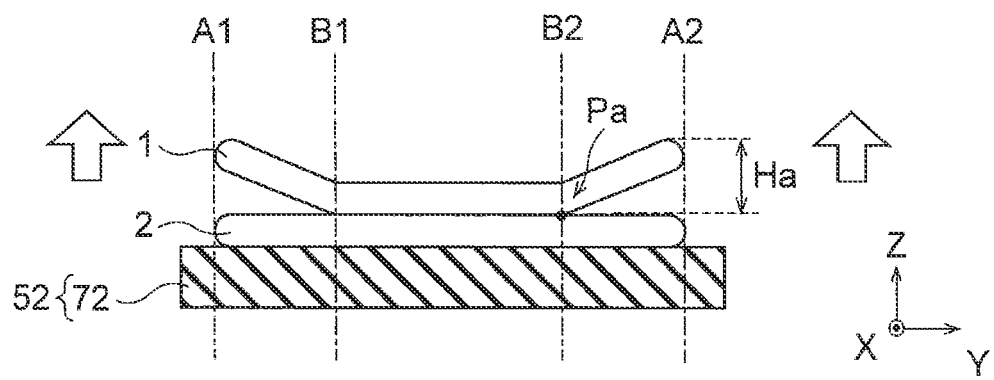
FIGS. 9A to 9C are cross-sectional views showing the operation of the semiconductor manufacturing apparatus of the first embodiment.
Figure 9B:
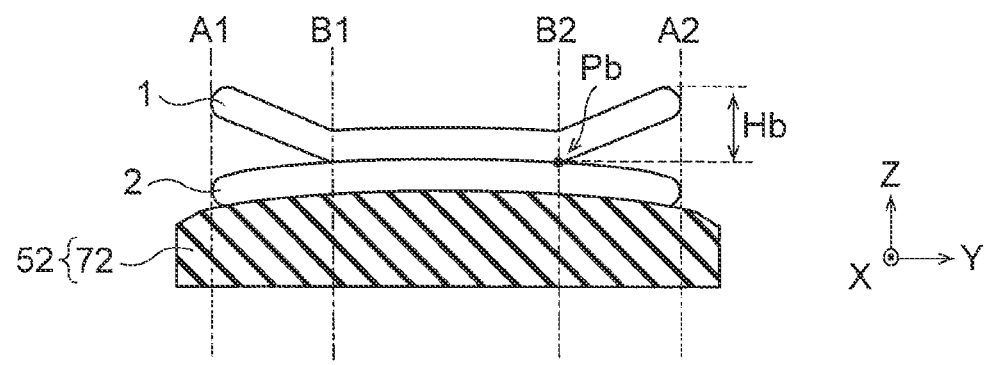
Figure 9C:
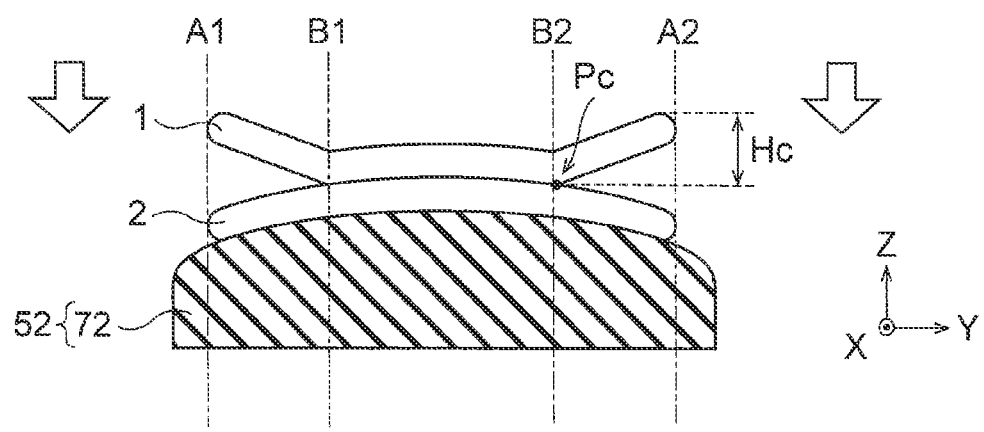

FIGS. 9A to 9C are cross-sectional views showing the operation of the semiconductor manufacturing apparatus of the first embodiment.

FIGS. 9A to 9C each shows the upper wafer 1 and the lower wafer 2 that are in the wait state shown in FIG. 6B. In FIG. 9A, the deformation amount of the lower chuck 52 is small; therefore, the lower wafer 2 is hardly deformed. In FIG. 9B, the deformation amount of the lower chuck 52 is medium; therefore, the lower wafer 2 is slightly deformed. In FIG. 9C, the deformation amount of the lower chuck 52 is large; therefore, the lower wafer 2 is greatly deformed. The ends Pa, Pb, and Pc of the present embodiment are all located on the straight lines B1, B2.

Now, the gap G (see FIG. 6A) between the upper wafer 1 and the lower wafer 2 before the bonding is started will be described.

Before the bonding in the comparative example described above is started, the value of the gap G is set to the same value in the cases of FIGS. 7A to 7C. That is, in the comparative example described above, the value of the gap G is set to the same value regardless of the different values of the deformation amount of the lower chuck 52.

On the other hand, before the bonding in the present embodiment is started, the value of the gap G is set to different values in the cases of FIGS. 9A to 9C. That is, in the present embodiment, if the value of the deformation amount of the lower chuck 52 is different, the value of the gap G is also set to be different. Specifically, the value of the gap G is set such that the gap G decreases as the deformation amount of the lower chuck 52 increases. For example, the gap G in the case of FIG. 9A is set to a large value, and the gap G in the case of FIG. 9C is set to a small value.

When the gap G is larger, the upper wafer 1 becomes more difficult to come into contact with the lower wafer 2 during the bonding. Therefore, the ends Pa shown in FIG. 9A are more difficult to be closer to the end portions of the upper wafer 1 and the lower wafer 2 than the ends Pa shown in FIG. 7A. On the other hand, when the gap G is smaller, the upper wafer 1 becomes easier to come into contact with the lower wafer 2 during the bonding. Therefore, the ends Pc shown in FIG. 9C are easier to be closer to the end portions of the upper wafer 1 and the lower wafer 2 than the ends Pc shown in FIG. 7C.

Therefore, according to the present embodiment, by reducing the gap G as the deformation amount of the lower chuck 52 increases, it is possible to bring all the ends Pa, Pb, and Pc closer to the straight lines B1, B2. That is, according to the present embodiment, even if the deformation amount of the lower chuck 52 is too small or too large, the stop position of the progress can be set to an appropriate position. The ends Pa, Pb, and Pc shown in FIGS. 9A, 9B, and 9C are all located on the straight lines B1, B2. Accordingly, it is possible to prevent the upper wafer 1 from being peeled off from the upper chuck 51 before the wait state is reached, and to prevent an error in the bonding position between the upper wafer 1 and the lower wafer 2 from becoming larger.

By reducing the value of the gap G as the deformation amount of the lower chuck 52 increases, the values of the heights Ha, Hb, and Hc are aligned. This makes it possible to align the positions of the ends Pa, Pb, and Pc.

Figure 10:
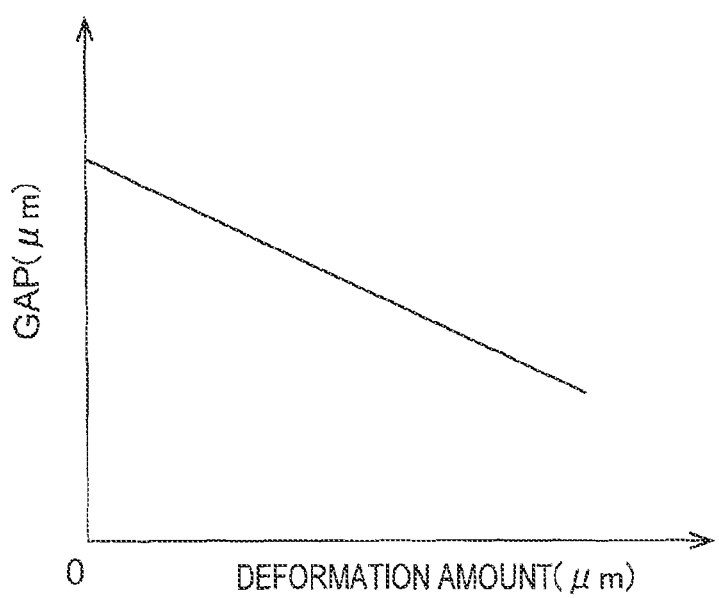
FIG. 10 is a graph for explaining the operation of the semiconductor manufacturing apparatus of the first embodiment.

FIG. 10 is a graph for explaining the operation of the semiconductor manufacturing apparatus of the first embodiment.

In FIG. 10, the horizontal axis indicates the deformation amount of the lower chuck 52, and the vertical axis indicates the gap G between the upper wafer 1 and the lower wafer 2 before the bonding is started. FIG. 10 shows a relationship between the deformation amount and the gap G in the present embodiment.

In the present embodiment, the value of the gap G is set such that the gap G decreases as the deformation amount of the lower chuck 52 increases. With this configuration, even if the deformation amount of the lower chuck 52 varies in various values, it is possible to set the stop position of the progress to an appropriate position. Although the gap G is expressed using a linear function of the deformation amount in FIG. 10, this may also be expressed using a function depending on the deformation amount in another aspect.

Figure 11:
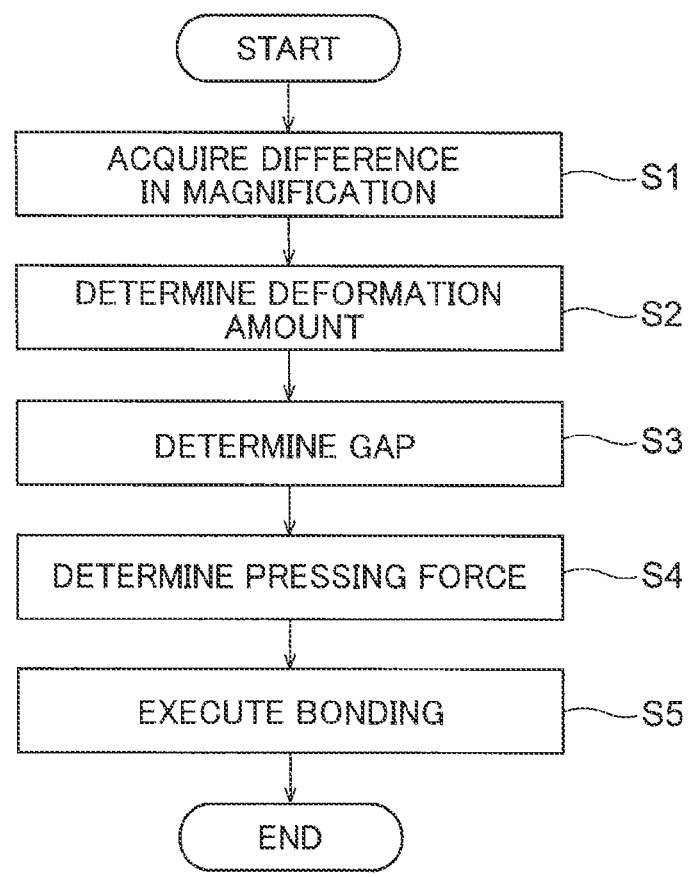
FIG. 11 is a flowchart showing the operation of the semiconductor manufacturing apparatus of the first embodiment.

FIG. 11 is a flowchart showing the operation of the semiconductor manufacturing apparatus of the first embodiment.

First, the controller 30 (FIG. 2) acquires a value of the difference in magnification between the upper wafer 1 and the lower wafer 2 (step S1). A measurement device in the semiconductor manufacturing apparatus of the present embodiment measures a value of the difference in magnification between the upper wafer 1 and the lower wafer 2, and transmits the measured value to the controller 30, for example. Alternatively, a measurement device outside the semiconductor manufacturing apparatus of the present embodiment may measure a value of the difference in magnification between the upper wafer 1 and the lower wafer 2 and transmit the measured value to the controller 30. The value of the difference in magnification between the upper wafer 1 and the lower wafer 2 may also be input to the controller 30 by a user of the semiconductor manufacturing apparatus of the present embodiment. The value of the difference in magnification between the upper wafer 1 and the lower wafer 2 can be measured, for example, by detecting alignment marks of the upper wafer 1 and the lower wafer 2.

Next, the controller 30 determines the value of the deformation amount of the lower chuck 52 based on the value of the difference in magnification described above (step S2). In the present embodiment, the value of the deformation amount is determined such that the difference in magnification decreases by controlling the deformation amount to the determined value described above. For example, when the value of the difference in magnification acquired in step S1 is small, the value of the deformation amount is determined to be a small value. On the other hand, when the value of the difference in magnification acquired in step S1 is large, the value of the deformation amount is determined to be a large value. According to the present embodiment, by determining the value of the deformation amount in this manner, it is possible to correct the difference in magnification between the upper wafer 1 and the lower wafer 2. In the present embodiment, the corrected value of the difference in magnification is smaller than the value of the difference in magnification before the correction.

Subsequently, the controller 30 determines the value of the gap G between the upper wafer 1 and the lower wafer 2 based on the above value of the deformation amount (step S3). In the present embodiment, the value of the gap G is determined such that the gap G decreases as the deformation amount increases. For example, when the value of the deformation amount determined in step S2 is small, the value of the gap G is determined to be a large value. On the other hand, when the value of the deformation amount determined in step S2 is large, the value of the gap G is determined to be a small value. According to the present embodiment, by determining the value of the gap G in this manner, it is possible to set the stop position of the progress at which the progress of the bonding between the upper wafer 1 and the lower wafer 2 stops in the wait state to an appropriate position.

Next, the controller 30 determines the value of the pressing force to press the upper wafer 1 by the striker 53d (FIGS. 6A to 6D, etc.) based on the value of the gap G described above (step S4). In the present embodiment, the value of the pressing force is determined such that the pressing force increases as the gap G increases. For example, the value of the gap G determined in step S3 is small, the value of the pressing force is determined to be a small value. On the other hand, when the value of the gap G determined in step S3 is large, the value of the pressing force is determined to be a large value. According to the present embodiment, by determining the value of the pressing force in this manner, the upper wafer 1 can be pressed with a suitable pressing force.

Then, the controller 30 controls the operation of the semiconductor manufacturing apparatus of the present embodiment to bond the upper wafer 1 and the lower wafer 2 together (step S5). Specifically, the controller 30 controls the deformation amount of the lower chuck 52 to the value determined in step S2 and controls the gap G between the upper wafer 1 and the lower wafer 2 to the value determined in step S3, before the bonding is started. Then, the controller 30 controls the operation of the bonding area 50 to bond the upper wafer 1 and the lower wafer 2 together as shown in FIGS. 6A to 6D. During this bonding, the controller 30 controls the deformation amount of the lower chuck 52 to the value determined in step S2 and controls the pressing force by the striker 53d to the value determined in step S4. Further, the gap G between the upper wafer 1 and the lower wafer 2 is set to the value determined in step S3 at the moment when the bonding is started (the moment shown in FIG. 6A). Accordingly, it is possible to suitably bond the upper wafer 1 and the lower wafer 2 together.

The semiconductor manufacturing apparatus of the present embodiment bonds the plurality of upper wafers 1 and the plurality of lower wafers 2 together for each pair of the upper wafer 1 and the lower wafer 2. For example, the first upper wafer 1 and the first lower wafer 2 are bonded together, and the second upper wafer 1 and the second lower wafer 2 are bonded together, and then the third upper wafer 1 and the third lower wafer 2 are bonded together.

In the present embodiment, the value of the gap G is determined for each pair of the upper wafer 1 and the lower wafer 2. For example, the gap G when the first upper wafer 1 and the first lower wafer 2 are bonded together is set to the first value; the gap G when the second upper wafer 1 and the second lower wafer 2 are bonded together is set to the second value; and the gap G when the third upper wafer 1 and the third lower wafer 2 are bonded together is set to the third value.

Figure 12:
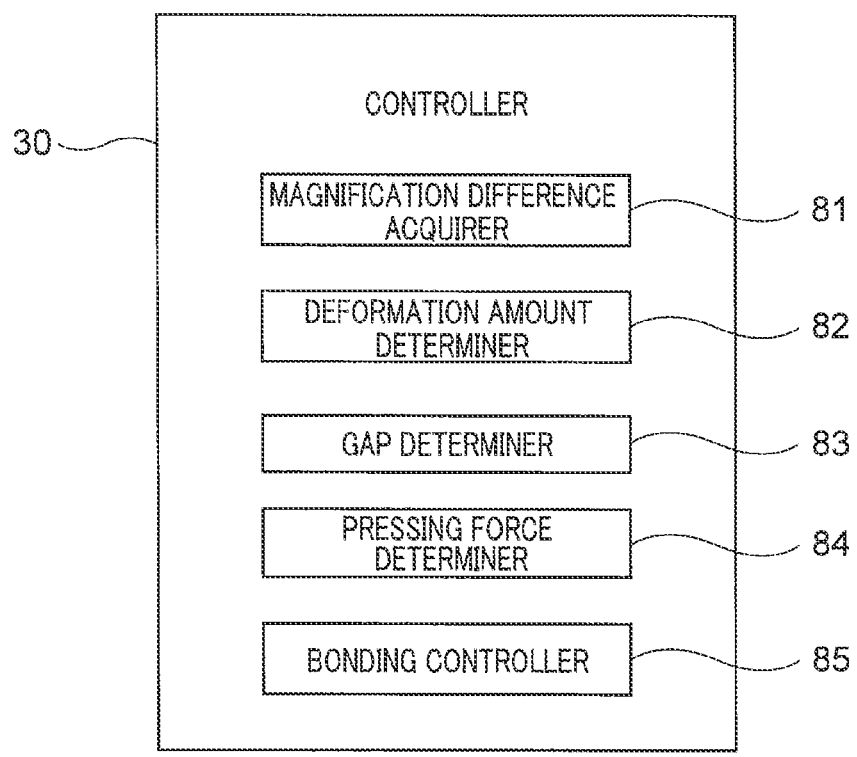
FIG. 12 is a block diagram showing the functional configuration of a controller 30 of the first embodiment.

FIG. 12 is a block diagram showing the functional configuration of the controller 30 of the first embodiment.

The controller 30 includes a magnification difference acquirer 81 that executes step S1, a deformation amount determiner 82 that executes step S2, a gap determiner 83 that executes step S3, a pressing force determiner 84 that executes step S4, and a bonding controller 85 that executes step S5. Each of these functional blocks (81 to 85) may be implemented by hardware or software.

These functional blocks are realized, for example, by a computer program that causes a processor in the controller 30 to execute steps S1 to S5. In this case, the controller 30 includes a computer-readable recording medium on which this program is installed. The whole or part of this program may be downloaded from the network to the recording medium.

[Modifications]

Figure 13A:
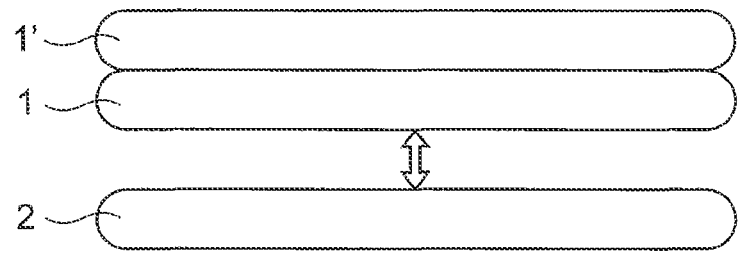
FIGS. 13A to 13C are cross-sectional views showing a method of manufacturing a semiconductor device of a modification of the first embodiment.
Figure 13B:
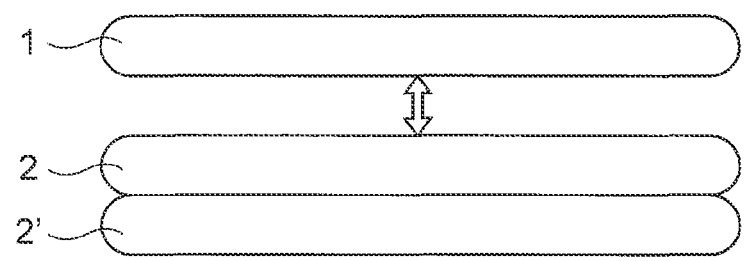
Figure 13C:
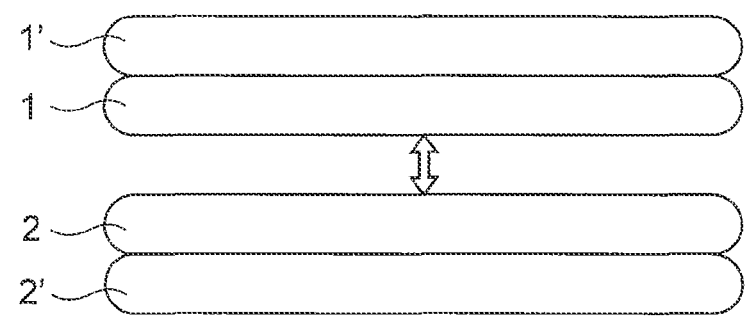

FIGS. 13A to 13C are cross-sectional views showing a method of manufacturing a semiconductor device of a modification of the first embodiment.

FIG. 13A shows the upper wafer 1, the lower wafer 2, and an upper wafer 1' previously bonded with the upper wafer 1. In this manner, the upper wafer 1 to be bonded in the present embodiment may be previously bonded with another upper wafer 1'.

FIG. 13B shows the upper wafer 1, the lower wafer 2, and a lower wafer 2' previously bonded with the lower wafer 2. In this manner, the lower wafer 2 to be bonded in the present embodiment may be previously bonded with another lower wafer 2'.

FIG. 13C shows the upper wafer 1, the lower wafer 2, the upper wafer 1' previously bonded with the upper wafer 1, and the lower wafer 2' previously bonded with the lower wafer 2. In this manner, the upper wafer 1 and the lower wafer 2 that are to be bonded together in the present embodiment may be previously bonded with another upper wafer 1' and another lower wafer 2', respectively.

The upper wafer 1 in FIG. 13A or 13C may be previously bonded with two or more upper wafers 1'. Further, the lower wafer 2 in FIG. 13B or 13C may be previously bonded with two or more lower wafers 2'.

Figure 14:
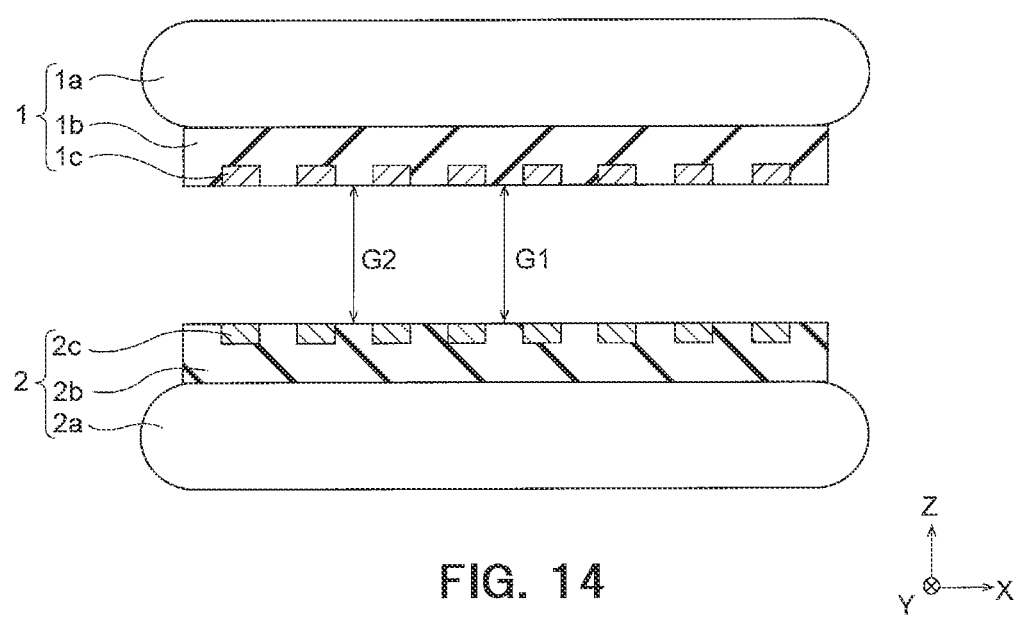
FIG. 14 is a cross-sectional view showing a method of manufacturing a semiconductor device of another modification of the first embodiment.

FIG. 14 is a cross-sectional view showing a method of manufacturing a semiconductor device of another modification of the first embodiment.

FIG. 14 shows a gap G1 and a gap G2 as examples of the gap G. The gap G1 is a gap between the center of the upper wafer 1 and the center of the lower wafer 2. The gap G2 is a gap between a portion other than the center of the upper wafer 1 and a portion other than the center of the lower wafer 2. In this manner, the gap G of the present embodiment may be defined between the centers of the upper wafer 1 and the lower wafer 2, or may be defined between portions other than the centers of the upper wafer 1 and the lower wafer 2.

As described above, the controller 30 of the present embodiment determines the value of the deformation amount of the lower chuck 52 based on the value of the difference in magnification between the upper wafer 1 and the lower wafer 2 and determines the value of the gap G between the upper wafer 1 and the lower wafer 2 based on the value of the deformation amount. In addition, the controller 30 of the present embodiment controls the deformation amount to the determined value described above and controls the gap G to the determined value described above before the bonding is started.

Therefore, according to the present embodiment, the upper wafer 1 and the lower wafer 2 can be suitably bonded together. For example, the stop position of progress at which the progress of bonding between the upper wafer 1 and the lower wafer 2 stops in the wait state can be set to an appropriate position; therefore, it is possible to prevent the upper wafer 1 from being peeled off from the upper chuck 51 before the wait state is reached, and to prevent an error in the bonding position between the upper wafer 1 and the lower wafer 2 from becoming larger.

Specifically, if the progress of bonding is too large, the upper wafer 1 might be peeled off from the upper chuck 51 before the wait state is reached; and consequently, an error in the bonding position between the upper wafer 1 and the lower wafer 2 becomes larger. On the other hand, if the progress of bonding is too small, an error in the bonding position between the upper wafer 1 and the lower wafer 2 might become larger. According to the present embodiment, it is possible to solve these problems by setting the stop position of progress at which the progress of bonding between the upper wafer 1 and the lower wafer 2 stops in the wait state to an appropriate position.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A semiconductor manufacturing apparatus comprising:
a magnification difference acquirer configured to acquire a value of difference in magnification between a first substrate and a second substrate;
a deformation amount determiner configured to determine a value of deformation amount of a chuck that holds the first or second substrate, based on the value of the difference in magnification;
a gap determiner configured to determine a value of a gap between the first substrate and the second substrate, based on the value of the deformation amount; and
a bonding controller configured to control the deformation amount to the determined value and control the gap to the determined value, before the first substrate and the second substrate are bonded together.

2. The apparatus of claim 1, wherein the deformation amount determiner determines the value of the deformation amount such that the difference in magnification decreases when the deformation amount is controlled to the determined value.

3. The apparatus of claim 1, wherein the gap determiner determines the value of the gap such that the gap decreases as the deformation amount increases.

4. The apparatus of claim 1, wherein the gap determiner determines the value of the gap between a center of the first substrate and a center of the second substrate.

5. The apparatus of claim 1, further comprising a pressing force determiner configured to determine a value of a pressing force to press the first or second substrate, based on the value of the gap,
wherein the bonding controller controls the pressing force to the determined value, when the first substrate and the second substrate are bonded together.

6. The apparatus of claim 5, wherein the pressing force determiner determines a value of a pressing force to press a center of the first or second substrate.

7. The apparatus of claim 5, wherein the pressing force determiner determines a value of a pressing force to press the first substrate, and the deformation amount determiner determines a value of deformation amount of the chuck that holds the second substrate.

8. The apparatus of claim 1, further comprising a bonder configured to be controlled by the bonding controller to bond the first substrate and the second substrate together.

9. The apparatus of claim 8, wherein the bonder includes a sucker configured to suck the first substrate, and a presser configured to press the first substrate with the pressing force.

10. The apparatus of claim 8, wherein
the bonder includes a first support configured to support a chuck that holds the first substrate, and a second support configured to support a chuck that holds the second substrate, and
the gap is controlled to the determined value by controlling the first or second support by the bonding controller.

11. A method of manufacturing a semiconductor device, comprising:
acquiring a value of difference in magnification between a first substrate and a second substrate;
determining a value of deformation amount of a chuck that holds the first or second substrate, based on the value of the difference in magnification;
determining a value of a gap between the first substrate and the second substrate, based on the value of the deformation amount; and
controlling the deformation amount to the determined value and controlling the gap to the determined value, before the first substrate and the second substrate are bonded together.

12. The method of claim 11, wherein the value of the gap is determined for each pair of the first and second substrates.

13. The method of claim 11, wherein the value of the deformation amount is determined such that the difference in magnification decreases when the deformation amount is controlled to the determined value.

14. The method of claim 11, wherein the value of the gap is determined such that the gap decreases as the deformation amount increases.

15. The method of claim 11, further comprising determining a value of a pressing force to press the first or second substrate, based on the value of the gap, wherein the pressing force is controlled to the determined value, when the first substrate and the second substrate are bonded together.

16. The method of claim 15, wherein the determination of the value of the pressing force determines a value of a pressing force to press a center of the first or second substrate.

17. The method of claim 15, wherein the determination of the value of the pressing force determines a value of a pressing force to press the first substrate, and the determination of the value of the deformation amount determines a value of the deformation amount of the chuck that holds the second substrate.

18. The method of claim 11, further comprising bonding the first substrate and the second substrate together by a bonder, while controlling the deformation amount to the determined value and controlling the gap to the determined value.

19. The method of claim 18, wherein the bonder includes a sucker configured to suck the first substrate, and a presser configured to press the first substrate with the pressing force.

20. The method of claim 18, wherein
the bonder includes a first support configured to support a chuck that holds the first substrate, and a second support configured to support a chuck that holds the second substrate, and
the gap is controlled to the determined value by controlling the first or second support.

\* \* \* \* \*